United States Patent
Chen et al.

(10) Patent No.: US 6,365,524 B1
(45) Date of Patent: Apr. 2, 2002

(54) METHOD FOR MAKING A CONCAVE BOTTOM OXIDE WITHIN A TRENCH

(75) Inventors: Chien-Hung Chen, Taipei Hsien; Chung-Yih Chen, Taipei; Jerry C. S. Lin, Tainan; Yen-Rong Chang, Taipei Hsien, all of (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/310,031

(22) Filed: May 11, 1999

(30) Foreign Application Priority Data

Apr. 8, 1999 (TW) .......................................... 88105590

(51) Int. Cl.[7] ........................ H01L 21/302; H01L 21/311
(52) U.S. Cl. ........................ 438/700; 438/703; 438/706; 438/723; 438/724
(58) Field of Search .............................. 438/700, 710, 438/745, 706, 703, 723, 724

(56) References Cited

U.S. PATENT DOCUMENTS

| | | | |
|---|---|---|---|
| 5,719,085 A | * | 2/1998 | Moon et al. ................. 438/424 |
| 5,786,262 A | * | 7/1998 | Jang et al. .................. 438/424 |
| 5,801,082 A | * | 9/1998 | Tseng ......................... 438/424 |
| 5,858,858 A | * | 1/1999 | Park et al. ................... 438/424 |

* cited by examiner

Primary Examiner—Benjamin L. Utech
Assistant Examiner—Lynette T. Umez-Eronini
(74) Attorney, Agent, or Firm—Chien-Wei (Chris) Chou; Oppenheimer Wolff & Donnelly LLP

(57) ABSTRACT

This present discloses a method for making a concave bottom oxide within a trench, the steps comprising: providing a semiconductor substrate; forming an insulating layer on the semiconductor substrate; defining the insulating layer to form an opening exposing the surface of the semiconductor substrate; dry-etching the exposed semiconductor substrate within the opening by using the first insulating layer as an etching mask to form a trench; depositing a first oxide layer conformably over the insulating layer, the side-walls and the bottom of the trench; depositing a second oxide layer on the first oxide layer and filling-up the trench surrounded by the first oxide layer; annealing to densify the first and second oxide layers; etching-back the first and second oxide layer to remove the portion overlying the first insulating layer, and forming a spacer consisting of the residual first oxide layer on the side-walls of the trench, and a concave bottom oxide consisting of the first and second oxide layers on the bottom of the trench.

15 Claims, 6 Drawing Sheets

METHOD FOR MAKING A CONCAVE BOTTOM OXIDE WITHIN A TRENCH

FIELD OF THE INVENTION

The invention relates to a trench process, and more particularly relates to a method for making a concave bottom oxide within a trench.

BACKGROUND OF THE INVENTION

A conventional trench process usually begins with the defining of the hard mask overlying the semiconductor substrate to form an opening exposing the surface of the semiconductor substrate. Then, the exposed semiconductor substrate within the opening is removed by means of wet- or dry-etching to form a trench. Subsequently, a silicon dioxide is formed overlying the side-walls and the bottom of the trench by means of thermal oxidation to oxidize a portion of the semiconductor substrate. However, the edge and the bottom of the trench could be rounder, thereby avoiding weak points in the edge of the trench, which results in leakage current.

Since the method described above comprises a thermal oxidation, the edge of resultant trench usually has so called "Bird's Beaks". Moreover, it is hard to well control the thickness of the silicon dioxide during the thermal oxidation process. Also, the leakage current will be apparent when the bottom oxide within the trench is too thick. Therefore, it is necessary to develop a novel method for making a concave bottom oxide within a trench to overcome the drawback of the above conventional trench method.

The process of the above conventional trench method is illustrated in detail in FIGS. 1A~1C and 2A~2C.

CONVENTIONAL EXAMPLE 1

First, referring to FIG. 1A, a semiconductor substrate 100, such as a silicon substrate, is provided. Then, a pad oxide 110 (e.g. a silicon dioxide layer) and a hard mask layer 120 (e.g. a nitride layer) are formed on the semiconductor substrate 100 in sequence. Then, photolithography procedures and etching techniques are applied to define the nitride 120 and the pad oxide layer 110 to form an opening 130 exposing the surface of the semiconductor substrate 100.

Next, referring to FIG. 1B, using the hard mask layer 120 and the pad oxide layer 110 as a mask, the exposed semiconductor substrate 100 within the opening 130 is removed by means of wet-etching, thereby a V-trench 140 is formed.

Then, referring to FIG. 1C, a thermal oxidation process is applied to oxidize a portion of the exposed semiconductor substrate 100 of the V-trench 140, thus a trench 150 with an overlying silicon dioxide layer 110' is formed.

Because the trench is defined by means of wet-etching, a V-trench is produced instead of a trench with a more vertical profile. In addition, the silicon dioxide layer 110' is formed by means of thermal oxidation, thereby the "Bird's beak" is apparent in the edges of result trench 150.

CONVENTIONAL EXAMPLE 2

First, referring to FIG. 2A, a semiconductor substrate 200, such as a silicon substrate, is provided. Then, a pad oxide 210 (e.g. a silicon dioxide layer) and a hard mask layer 220 (e.g. a nitride layer) are formed on the semiconductor substrate 200 in sequence. Then, photolithography procedures and etching techniques are applied to define the nitride 220 and the pad oxide layer 210 to form an opening 230 exposing the surface of the semiconductor substrate 200.

Next, referring to FIG. 2B, using the hard mask layer 220 and the pad oxide layer 210 as a mask, the exposed semiconductor substrate 200 within the opening 230 is removed by means of dry-etching, thereby a U-trench 240 is formed.

Next, referring to FIG. 2C, a thermal oxidation process is applied to oxidize a portion of the exposed semiconductor substrate 200 of the U-trench 240, thus a trench 250 with an overlying silicon dioxide layer 210' is formed.

It is noted that the trench is defined by means of dry-etching, thereby a trench with a more vertical profile can be obtained. However, the silicon dioxide layer 210' is still formed by means of thermal oxidation in order to produce a trench 250 with a rounder bottom, thereby the "Bird's beak" is still apparent in the edges of trench 250.

In order to address the drawback of the conventional trench process described above, it is necessary to develop a novel trench process to make a concave bottom oxide within a trench.

SUMMARY OF THE INVENTION

In order to address the drawback of the conventional trench process described above, this invention discloses a method for making a concave bottom oxide within a trench.

The feature of the invention is to provide a method for making a concave bottom oxide within a trench, the steps comprising: providing a semiconductor substrate; forming an insulating layer on the semiconductor substrate; defining the insulating layer to form an opening exposing the surface of the semiconductor substrate; dry-etching the exposed semiconductor substrate within the opening by using the first insulating layer as an etching mask to form a trench; depositing a first oxide layer conformably over the insulating layer, the side-walls and the bottom of the trench; depositing a second oxide layer on the first oxide layer and filling-up the trench surrounded by the first oxide layer; annealing to densify the first and second oxide layers; etching-back the first and second oxide layer to remove the portion overlying the first insulating layer, and forming a spacer consisting of the residual first oxide layer on the side-walls of the trench, and a concave bottom oxide consisting of the first and second oxide layers on the bottom of the trench.

In the method according to this invention described, the insulating layer comprises a pad oxide layer and a nitride layer. The nitride layer consists of silicon nitride or silicon oxynitride. The first oxide layer is formed by means of CVD using $O_3$/TEOS as reactants, and the ratio of $O_3$/TEOS is less than 16. The second oxide layer is formed by means of CVD using $O_3$/TEOS as reactant, and the ratio of $O_3$/TEOS is more than 16. The etching-back step is applied by means of wet-etching. The wet-etching step is performed by using 5% HF as an etchant.

Other features and advantages of the invention will be apparent from the following detailed description, and from the claims.

DETAILED DESCRIPTION OF THE INVENTION

The present invention provides a novel method for making a concave bottom oxide within a trench.

According to the present invention, a substrate is provided first, wherein the substrate can further comprise semiconductor devices. Next, an insulating layer is formed on the semiconductor substrate. For example, the insulating layer could consist of a CVD pad oxide layer and a hard mask. The pad oxide layer could consist of silicon dioxide, and the hard mask could consist of nitride, such as silicon nitride or silicon oxynitride. Then, photolithography procedures and etching techniques are applied to define the hard mask and the pad oxide layer to form an opening exposing the surface of the semiconductor substrate.

Next, by using the hard mask and the pad oxide layer as a mask, the exposed semiconductor substrate within the opening is removed by means of dry-etching, thereby a trench with a more vertical profile is obtained.

Next, a first $O_3$-TEOS layer is formed on the hard mask and over the side-walls and the bottom of the produced trench by means of CVD using $O_3$/TEOS as reactants, wherein the ratio of $O_3$/TEOS is less than 16. Then, a second $O_3$-TEOS layer is formed on the $O_3$-TEOS layer and filling-up the trench by means of CVD using $O_3$/TEOS as reactants, wherein the ratio of $O_3$/TEOS is more than 16. Subsequently, an annealing treatment is applied to densify the first and second $O_3$-TEOS layers.

Then, the second and first $O_3$-TEOS layers overlying the hard mask and a portion of the second and first $O_3$-TEOS layers within trench are removed by wet-etching using 5% HF as a etchant. Thus, an oxide spacer consisting of the residual first $O_3$-TEOS layer is formed on the side-walls of the trench and a concave bottom oxide consisting of the residual first and second $O_3$-TEOS layers is produced. The concave bottom oxide consisting of the residual first and second $O_3$-TEOS layers, thereby the thickness of the concave bottom oxide is thicker than that of the oxide spacer consisting of only residual first $O_3$-TEOS layer.

By means of the method described above, a concave bottom oxide with round corners can be made within the bottom of the trench, thereby weak-points resulting in leakage current and the "Bird's beak" in the surface of the trench are eliminated.

EMBODIMENT OF THE INVENTION

Figure 1A:
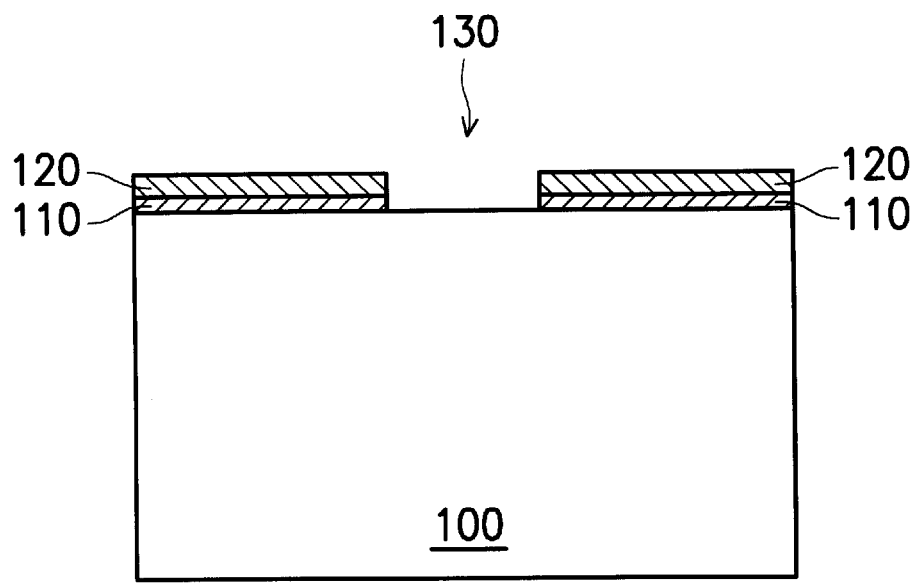
FIGS. 1A~1C are cross-sectional views of a conventional process for making a trench.
Figure 1B:
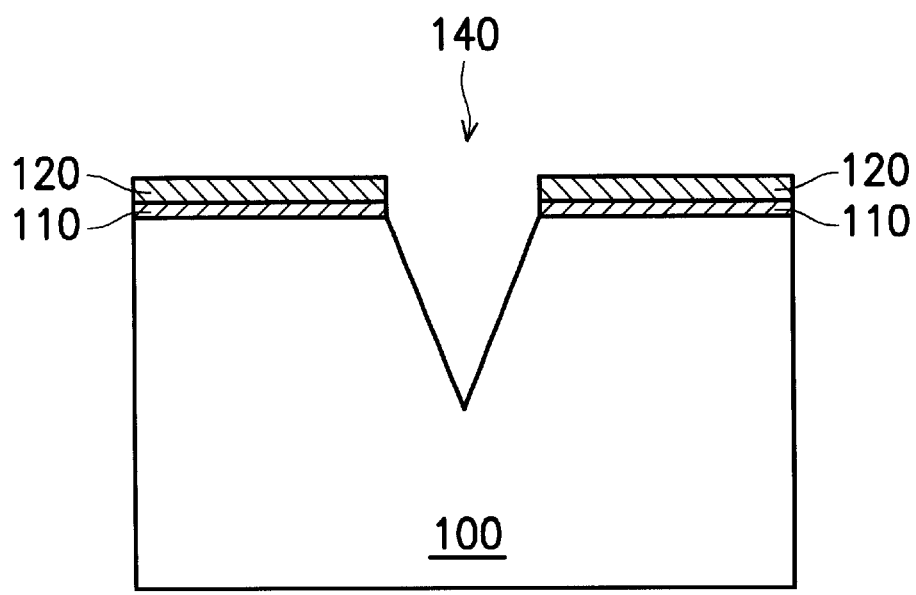
Figure 1C:
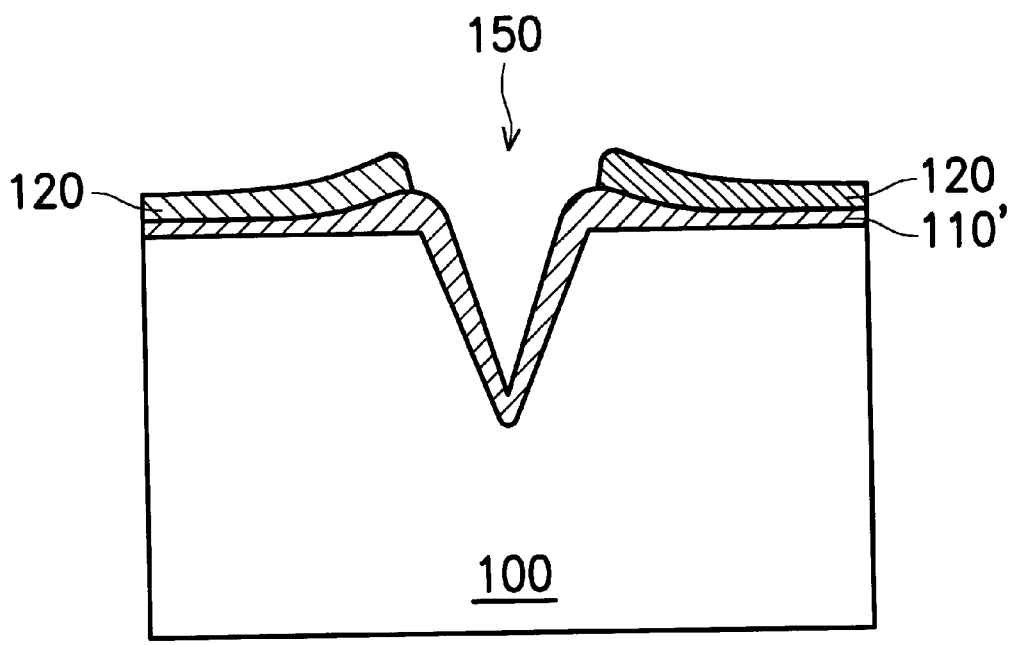
Figure 2A:
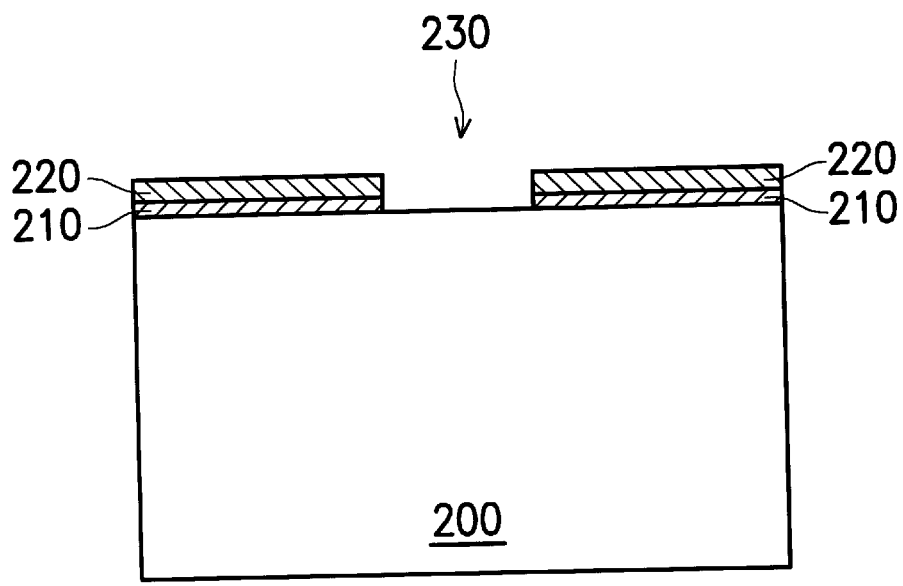
FIGS. 2A~2C are cross-sectional views of another conventional process for a making trench.
Figure 2B:
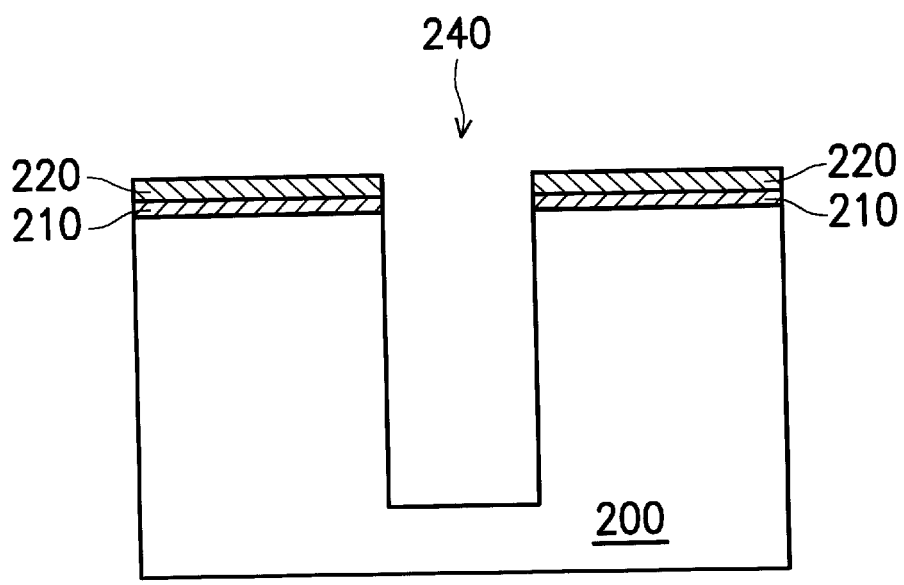
Figure 2C:
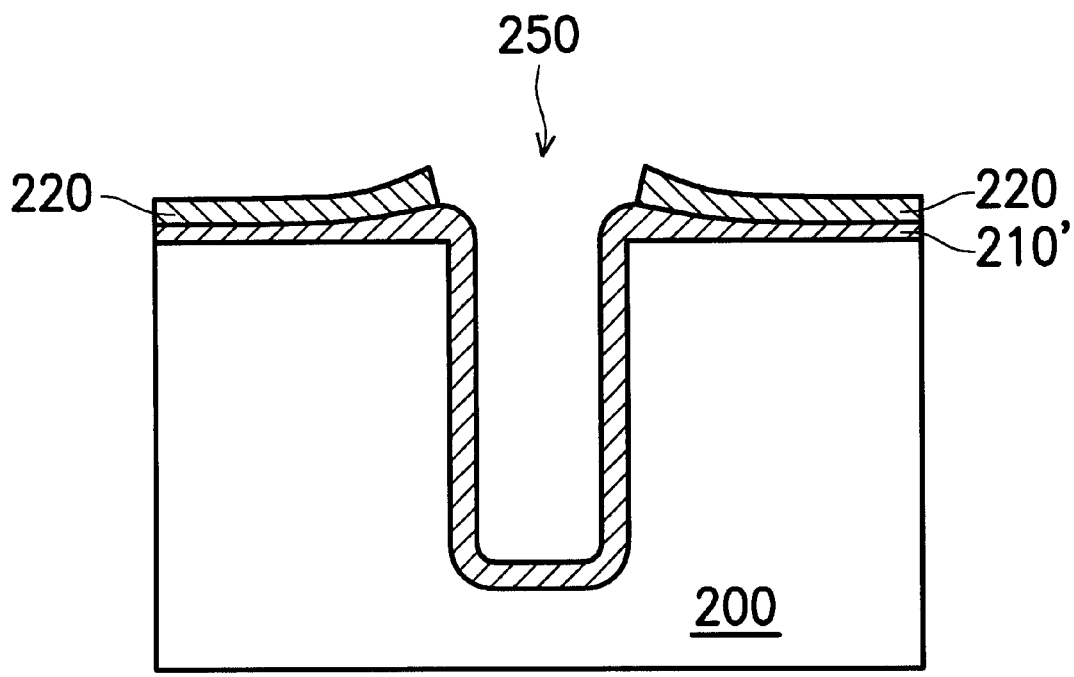
Figure 3A:
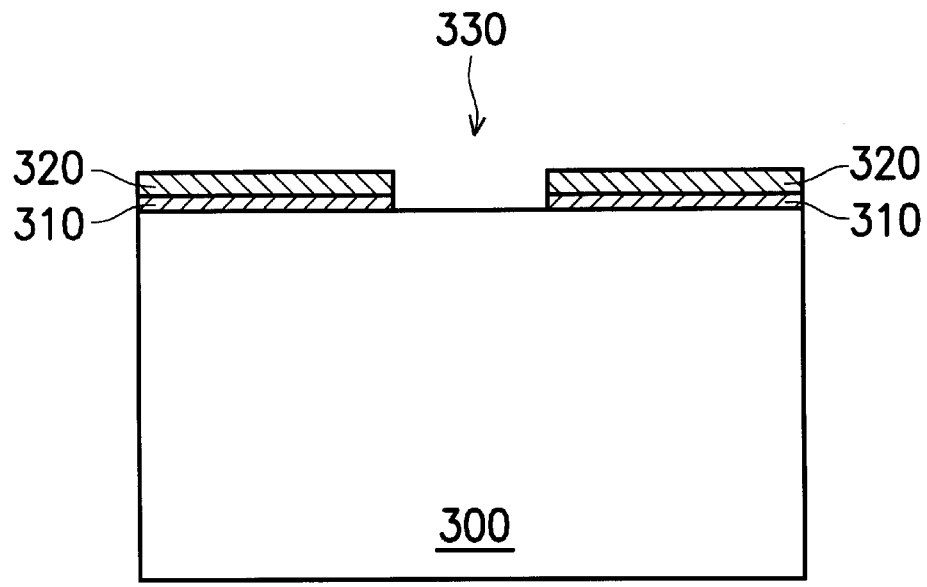
FIGS. 3A~3D are cross-sectional views of a process for making a concave bottom oxide within a trench according to an embodiment of this invention.

First, referring to FIG. 3A, a semiconductor substrate 300 was provided. Then, an insulating layer was formed on the semiconductor substrate 300. For example, the insulating layer could consist of a CVD pad oxide layer 310 and a hard mask 320. The pad oxide layer 310 in this embodiment consists of silicon dioxide, and the hard mask 320 consists of nitride, such as silicon nitride or silicon oxynitride. Then, photolithography procedures and etching techniques were applied to define the hard mask 320 and the pad oxide layer 310 to form an opening 330 exposing the surface of the semiconductor substrate 300.

Figure 3B:
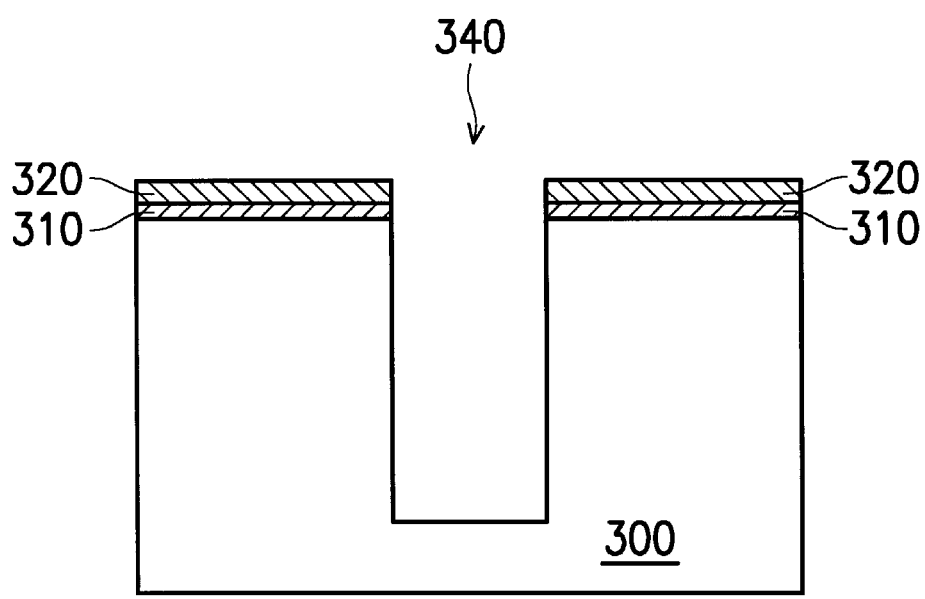

Next, referring to FIG. 3B, using the hard mask 320 and the pad oxide layer 310 as a mask, the exposed semiconductor substrate 300 within the opening 330 was removed by means of dry-etching, thereby a trench 340 with a more vertical profile was formed.

Figure 3C:
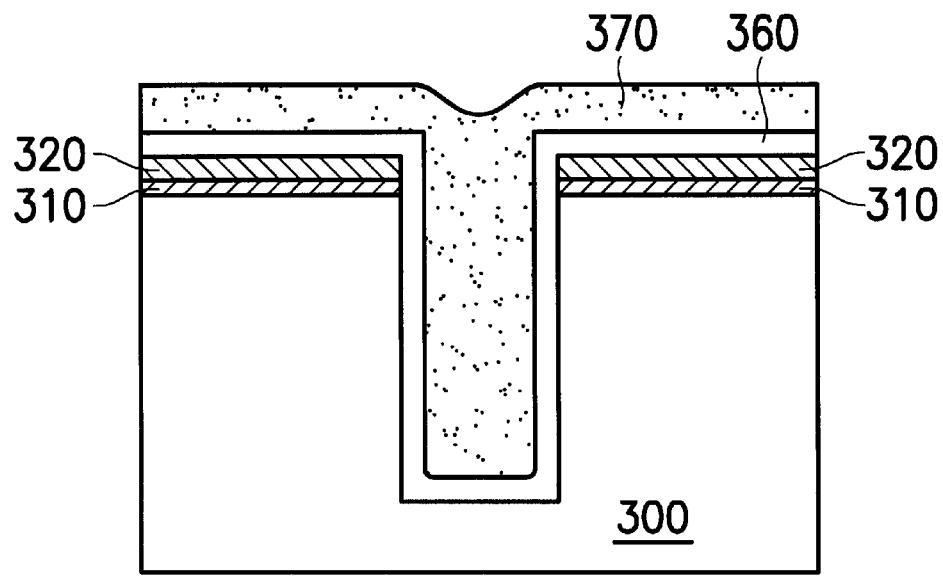

Next, referring to FIG. 3C, an $O_3$-TEOS layer 360 with a thickness of 500 Å was formed on the hard mask 320, and over the side-walls and the bottom of the trench 340 by means of CVD using $O_3$/TEOS as reactants, wherein the ratio of $O_3$/TEOS is less than 16. Then, another $O_3$-TEOS layer 370 was formed on the $O_3$-TEOS layer 360 and filling-up trench 340 by means of CVD using $O_3$/TEOS as reactants, wherein the ratio of $O_3$/TEOS is more than 16.

Subsequently, an annealing treatment was applied to densify the $O_3$-TEOS layers 360 and 370.

Figure 3D:
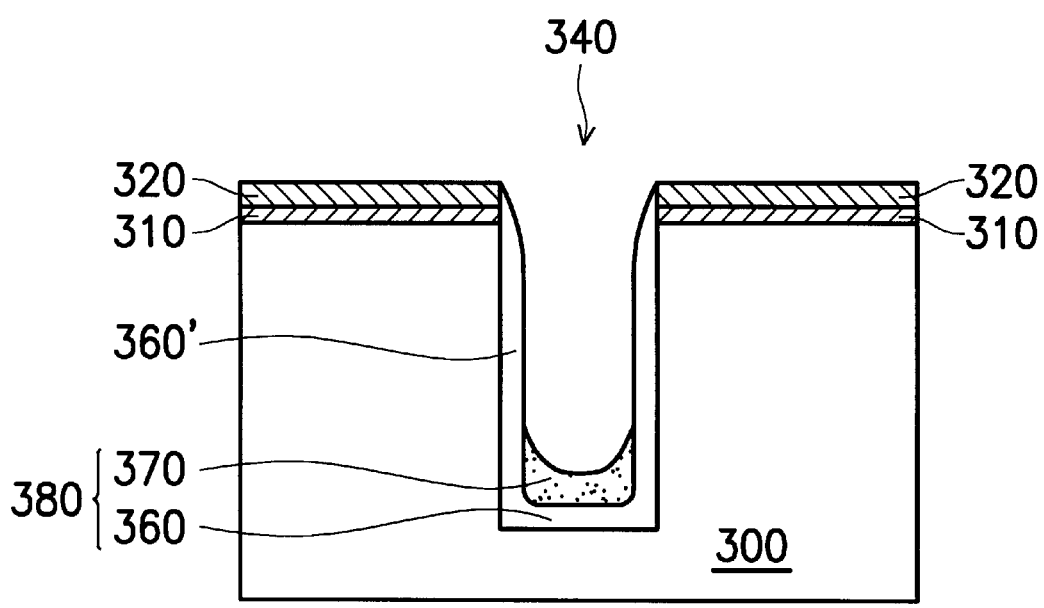

Then, referring to FIG. 3D, the $O_3$-TEOS layers 370 and 360 overlying the hard mask 320 and a portion of the $O_3$-TEOS layers 370 and 360 within trench 340 were removed by wet-etching using 5% HF as an etchant. Thus, an oxide spacer 360' consisting of residual $O_3$-TEOS layer 360 was formed on the side-walls of trench 340 and a concave bottom oxide 380 consisted of the residual $O_3$-TEOS layers 360 and 370. The concave bottom oxide 380 consists of the residual $O_3$-TEOS 360 and 370, thereby the thickness of the concave bottom oxide 380 is thicker than that of the oxide spacer 360' consisting of only residual $O_3$-TEOS layer 360.

By means of the method described above, a concave bottom oxide with round corners was made within the bottom of the trench, thereby weak-points resulting in leakage current and the "Bird's beak" in the surface of the trench were avoided.

From the above description, one skilled in this art can easily ascertain the essential characteristics of the present invention, and, without departing from the spirit and scope thereof, can make various changes and modifications of the invention to adapt it to various usages and conditions. Thus, other embodiments also fall within the scope of the following claims.

What is claim:

1. A method for fabricating a concave bottom oxide within a trench, the steps comprising:
   providing a semiconductor substrate;
   forming an insulating layer on the semiconductor substrate;
   defining the insulating layer to form an opening exposing the surface of the semiconductor substrate;
   dry-etching the exposed semiconductor substrate within the opening by using the first insulating layer as an etching mask to form a trench;
   depositing a first oxide layer conformably over the insulating layer, side-walls and the bottom of the trench;
   depositing a second oxide layer on the first oxide layer and filling-up the trench surrounded by the first oxide layer;
   annealing to densify the first and second oxide layers;
   etching-back the first and second oxide layer to remove a portion overlying the first insulating layer, and forming a spacer consisting of a residual first oxide layer on the side-walls of the trench, and a concave bottom oxide consisting of the first and second oxide layers on the bottom of the trench.

2. The method as claimed in claim 1, wherein the insulating layer consists of a pad oxide layer and a nitride layer.

3. The method as claimed in claim 2, wherein the pad oxide layer consists of silicon dioxide.

4. The method as claimed in claim 2, wherein the nitride layer is selected from the group consisting of silicon nitride and silicon oxynitride.

5. The method as claimed in claim 1, wherein the first oxide layer is formed by means of CVD using $O_3$/TEOS as reactants, and the ratio of $O_3$/TEOS is less than 16.

6. The method as claimed in claim 1, wherein the second oxide layer is formed by means of CVD using $O_3$/TEOS as reactant, and the ratio of $O_3$/TEOS is more than 16.

7. The method as claimed in claim 1, wherein the etching-back is applied by means of wet-etching.

8. The method as claimed in claim 7, wherein the wet-etching is performed by using 5% HF as an etchant.

9. A method for fabricating a concave bottom oxide within a trench, the steps comprising:

providing a semiconductor substrate having a surface;

forming an insulating layer on the semiconductor substrate;

forming an opening in the insulating layer exposing a portion of the surface of the semiconductor substrate;

forming a trench in the exposed surface of the semiconductor substrate, the trench having side-walls and a bottom;

depositing a first oxide layer conformably over the insulating layer, the side-walls and the bottom of the trench;

depositing a second oxide layer on the first oxide layer, wherein the second oxide layer substantially fills the trench;

annealing to densify the first and second oxide layers;

etching-back a portion of the first and second oxide layer, forming a spacer consisting of a residual first oxide layer on the side-walls of the trench, and a concave bottom oxide consisting of the first and second oxide layers on the bottom of the trench.

10. The method as claimed in claim 9, wherein the insulating layer consists of a pad oxide layer and a nitride layer.

11. The method as claimed in claim 10, wherein the pad oxide layer consists of silicon dioxide.

12. The method as claimed in claim 10, wherein the nitride layer is selected from the group consisting essentially of silicon nitride and silicon oxynitride.

13. The method as claimed in claim 9, wherein the first oxide layer is formed by means of CVD using $O_3$/TEOS as reactants, and the ratio of $O_3$/TEOS is less than 16.

14. The method as claimed in claim 9, wherein the second oxide layer is formed by means of CVD using $O_3$/TEOS as reactant, and the ratio of $O_3$/TEOS is more than 16.

15. The method as claimed in claim 9, wherein the etching-back is applied by means of wet-etching.

* * * * *